(12) United States Patent
Matsuura et al.

(10) Patent No.: US 9,029,885 B2
(45) Date of Patent: May 12, 2015

(54) ELECTRODE FOIL AND ELECTRONIC DEVICE

(71) Applicant: Mitsui Mining & Smelting Co., Ltd., Tokyo (JP)

(72) Inventors: Yoshinori Matsuura, Kanagoe (JP); Nozomu Kitajima, Omuta (JP); Toshimi Nakamura, Ageo (JP); Masaharu Myoi, Ageo (JP)

(73) Assignee: Mitsui Mining & Smelting Co., Ltd., Tokyo (JP)

( * ) Notice: Subject to any disclaimer, the term of this patent is extended or adjusted under 35 U.S.C. 154(b) by 0 days.

(21) Appl. No.: 13/981,804

(22) PCT Filed: Dec. 26, 2012

(86) PCT No.: PCT/JP2012/083620
§ 371 (c)(1),
(2) Date: Jul. 25, 2013

(87) PCT Pub. No.: WO2013/161129
PCT Pub. Date: Oct. 31, 2013

(65) Prior Publication Data
US 2014/0061701 A1    Mar. 6, 2014

(30) Foreign Application Priority Data
Apr. 23, 2012  (JP) .................................. 2012-097854

(51) Int. Cl.
| | |
|---|---|
| *H01L 33/00* | (2010.01) |
| *H01L 33/38* | (2010.01) |
| *H05B 33/26* | (2006.01) |
| *H01L 31/0224* | (2006.01) |
| *H01L 51/00* | (2006.01) |
| *H01L 31/0392* | (2006.01) |

(Continued)

(52) U.S. Cl.
CPC ................ *H01L 33/38* (2013.01); *H05B 33/26* (2013.01); *Y02E 10/549* (2013.01); *H01L 33/405* (2013.01); *H01L 31/022408* (2013.01); *H01L 33/42* (2013.01); *H01L 51/0096* (2013.01); *H01L 31/0392* (2013.01); *H01L 31/056* (2014.12)

(58) Field of Classification Search
CPC ............ H01L 51/5012; H01L 51/5203; H01L 51/5206; H01L 51/5218; H01L 51/5221; H01L 51/5268; H01L 51/5278
USPC ............. 257/40, 95, 98, E31.095; 438/22, 29
See application file for complete search history.

(56) References Cited

U.S. PATENT DOCUMENTS

| | | | |
|---|---|---|---|
| 6,435,014 B1 * | 8/2002 | Palmquist et al. ............... | 73/104 |
| 2010/0038115 A1 * | 2/2010 | Matsuda et al. ............... | 174/254 |

(Continued)

FOREIGN PATENT DOCUMENTS

| | | | | |
|---|---|---|---|---|
| JP | 2005216705 A | | 8/2005 | |
| JP | 2006-331694 | * | 12/2006 | ............. H05B 33/02 |

(Continued)

*Primary Examiner* — Khiem D Nguyen
(74) *Attorney, Agent, or Firm* — The Webb Law Firm

(57) ABSTRACT

There is provided an electrode foil, which can show superior light scattering, while preventing short circuit between electrodes. The electrode foil of the present invention comprises a metal foil having a thickness of from 1 μm to 250 μm, wherein the electrode foil comprises, on at least one outermost surface thereof, a light-scattering surface having a Pv/Pp ratio of 2.0 or higher, wherein the Pv/Pp ratio is a ratio of a maximum profile valley depth Pv of a profile curve to a maximum profile peak height Pp of the profile curve as measured in a rectangular area of 181 μm×136 μm in accordance with JIS B 0601-2001.

18 Claims, 9 Drawing Sheets

(51) Int. Cl.
*H01L 31/056* (2014.01)
*H01L 33/40* (2010.01)
*H01L 33/42* (2010.01)

(56) References Cited

U.S. PATENT DOCUMENTS

2012/0129048 A1* 5/2012 Fukui et al. .................. 429/217
2013/0069042 A1   3/2013 Matsuura et al.

FOREIGN PATENT DOCUMENTS

| | | |
|---|---|---|
| JP | 2007234254 A | 9/2007 |
| JP | 2008243772 A | 10/2008 |
| JP | 2009152113 A | 7/2009 |
| JP | 2011222819 A | 11/2011 |
| WO | 2011111629 A1 | 9/2011 |
| WO | 2011152091 A1 | 12/2011 |
| WO | 2011152092 A1 | 12/2011 |

* cited by examiner

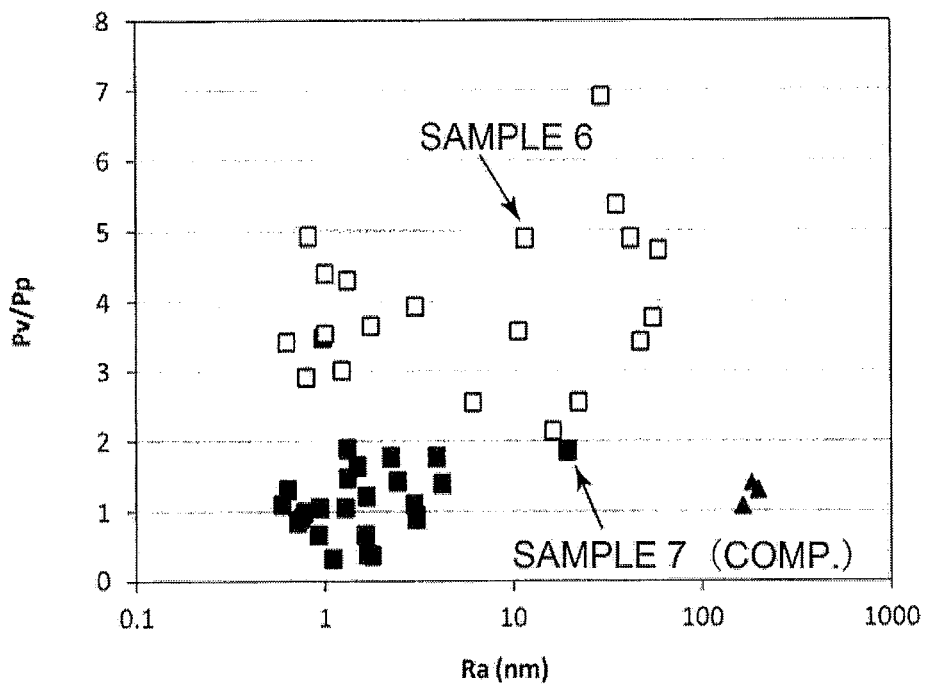

☐ : Electrode foil samples of which optical properties were improved 1.2 times or more by scattering
■ : Electrode foil samples in which desired element characteristic could be attained but the optical properties were not improved 1.2 times or more
▲ : Electrode foil samples which were short-circuited with a counter electrode and in which the desired element characteristic could not be attained

FIG. 8

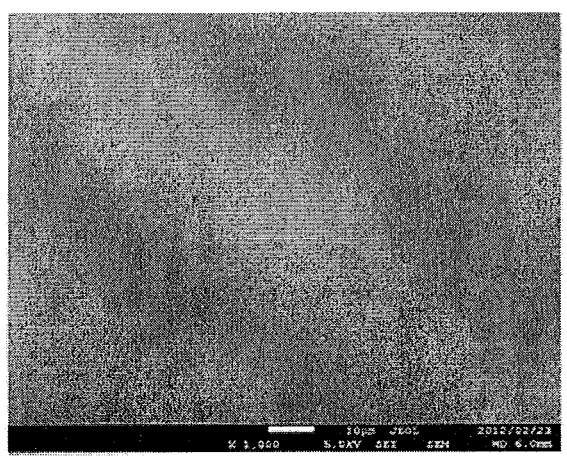

FIG. 9

ELECTRODE FOIL AND ELECTRONIC DEVICE

CROSS-REFERENCE TO RELATED APPLICATION

This application claims priority to Japanese Patent Application No. 2012-097854 filed on Apr. 23, 2012, the entire disclosure of which is incorporated herein by reference.

TECHNICAL FIELD

The present invention relates to an electrode foil using a metal foil, and to an electronic device using the electrode foil, such as a light-emitting element, a photo-electric element or the like.

BACKGROUND ART

In recent years, light-emitting element such as organic EL lighting has been drawing attention as an eco-friendly green device. Features of the organic EL lighting include: 1) a low power consumption as compared with an incandescent lamp; 2) a thin profile and light weight; and 3) a flexibility. At the moment, the organic EL lightings are being developed so as to attain the above features of 2) and 3). In this respect, glass substrates that have been conventionally used in flat panel displays (FPD) and the like are unable to attain the above features of 2) and 3).

In view of this, there are researches being conducted on a substrate as a support (hereinafter, "supporting base material") for organic EL lighting, proposing an ultra-thin glass, a resin film, a metal foil or the like as a possible supporting base material. The ultra-thin glass is superior in heat resistance, barrier performance and optical transparency and has good flexibility, but is somewhat inferior in handling and has low thermal conductivity and high material cost. Further, the resin film is superior in handling and flexibility and has low material cost and good optical transparency, but is inferior in heat resistance and barrier performance and has low thermal conductivity.

In contrast, apart from the absence of optical transparency, the metal foil has excellent features such that it is superior in heat resistance, barrier performance, handling, and thermal conductivity and also has good flexibility and low material cost. In particular, a typical flexible glass or film has an extremely low thermal conductivity of 1 W/m° C. or lower, while a copper foil has an extremely high thermal conductivity of around 280 W/m° C.

In order to attain a light-emitting element using a metal substrate, Patent Literature 1 (JP2009-152113A) proposes that a surface of the metal substrate is smoothed by polishing treatment and plating treatment, and that thereon an organic layer is formed. In addition, Patent Literature 2 (JP2008-243772A) proposes that by providing a nickel plated layer on the metal substrate, a smooth surface is formed without polishing and the like, and that thereon an organic EL element is formed. On the other hand, a photo-electric element using a metal substrate is proposed, for example, Patent Literature 3 (JP2011-222819A) discloses a solar cell with an organic thin film electromotive force layer provided on the smoothing-treated metal base material. In these techniques, for prevention of short circuit between electrodes, it is an important subject to smooth the surface of the metal substrate. As techniques that deal with the subject, Patent Literature 4 (WO2011/152091) and Patent Literature 5 (WO2011/152092) propose that a metal foil comprising an ultra-smooth surface, which has an extremely low arithmetic average roughness Ra of 10.0 nm or less, is used as both a supporting base material and an electrode.

Turning to the light-emitting element and the photo-electric element, it is known to be advantageous to scatter light by the surface of the metal foil, in order to bring out light or to take in light efficiently. Namely, high light scattering results in an increase in light-emitting efficiency in the light-emitting element, and thus increases power generation efficiency in the photo-electric element. In this respect, since it is difficult to sufficiently scatter light without resulting in short circuit at the surface of the conventional metal foil, in the case of the light-emitting element, an attempt is made to improve light-emitting efficiency by disposing microlens or the like on the light-takeoff side of the substrate surface. However, formation of the microlens or the like is not advantageous from the viewpoint of productivity and cost due to the necessity of microfabrication, and therefore it is impossible to say that the disposition of the microlens is suitable for widening of area.

CITATION LIST

Patent Literature

[Patent Literature 1] JP2009-152113A
[Patent Literature 2] JP2008-243772A
[Patent Literature 3] JP2011-222819A
[Patent Literature 4] WO2011/152091
[Patent Literature 5] WO2011/152092

SUMMARY OF INVENTION

The inventors have currently found that providing the surface itself of a metal foil with a specific surface profile, in which concave parts are predominant, enables attainment of an electrode foil which can exhibit superior light scattering, while preventing short circuit between electrodes when used for an electronic device such as a light-emitting element and a photo-electric element, and that thereby the electrode foil itself can improve light-emitting efficiency and power generation efficiency.

It is thus an object of the present invention to provide an electrode foil, which can exhibit superior light scattering, while preventing short circuit between electrodes.

According to an aspect of the present invention, there is provided an electrode foil comprising a metal foil having a thickness of from 1 μm to 250 μm, wherein the electrode foil comprises, on at least one outermost surface thereof, a light-scattering surface having a Pv/Pp ratio of 2.0 or higher, wherein the Pv/Pp ratio is a ratio of a maximum profile valley depth Pv of a profile curve to a maximum profile peak height Pp of the profile curve as measured in a rectangular area of 181 μm×136 μm in accordance with JIS B 0601-2001.

According to another aspect of the present invention, there is provided an electronic device comprising:
the above electrode foil; and
a semiconductor functional layer having semiconductor properties, the semiconductor functional layer being provided on the light-scattering surface of the electrode foil.

BRIEF DESCRIPTION OF DRAWINGS

FIG. 8 is a view plotting a relation between an arithmetic average roughness Ra and the Pv/Pp ratio of the electrode foil prepared in Example 2.

FIG. 9 is an image obtained by observing a surface of sample 6, shown in FIG. 8, with SEM (1,000 times).

DESCRIPTION OF EMBODIMENT

Electrode Foil

Figure 1:
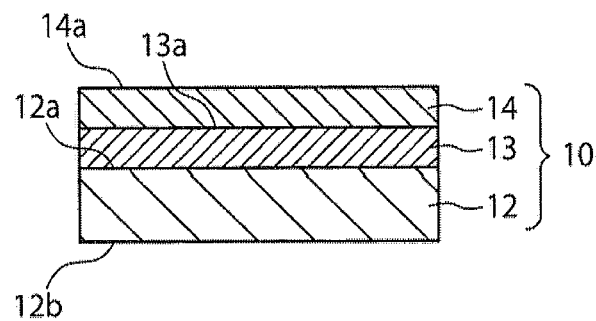
FIG. 1 is a schematic cross-sectional view illustrating an example of the electrode foil according to the present invention.

FIG. 1 shows a schematic cross-sectional view of an example of the electrode foil according to the present invention. The electrode foil 10 shown in FIG. 1 comprises a metal foil 12 having a thickness of from 1 μm to 250 μm. The electrode foil 10 may optionally comprise a reflective layer 13 provided directly on one side or both sides of the metal foil 12, or thereabove via a diffusion prevention layer. Further, the electrode foil 10 may optionally comprise a buffer layer 14 provided directly on at least one side or both sides of the metal foil 12 or, if present, on the surface of the reflective layer 13. Although the electrode foil 10 shown in FIG. 1 has a three-layer structure composed of the metal foil 12, the reflective layer 13 and the buffer layer 14, the electrode foil of the present invention is not limited thereto but may be a one-layer structure composed of the metal foil 12 or a two-layer structure composed of the metal foil 12 and the reflective layer 13. Alternatively, it may be a five-layer structure composed of the reflective layers 13 and the buffer layers 14 provided on both sides of the metal foil 12.

At least one outermost surface of the electrode foil 10 comprises a light-scattering surface of which the Pv/Pp ratio, which is the ratio of a maximum profile valley depth Pv of a profile curve to a maximum profile peak height Pp of the profile curve as measured in a rectangular area of 181 μm×136 μm in accordance with JIS B 0601-2001, is 2.0 or higher. The maximum profile peak height Pp represents a height of convex parts, while the maximum profile valley depth Pv represents a depth of concave parts. Therefore, the Pv/Pp ratio of 2.0 or higher means a specific surface profile which comprises the concave parts more preferentially than the convex parts. According to the finding of the inventors, by providing the electrode foil 10 with such a specific surface profile, in which concave parts are predominant, the electrode foil itself can exhibit superior light scattering and thereby the electrode foil itself can improve light-emitting efficiency and power generation efficiency. This is considered to result from light scattering caused by the concave parts formed preferentially as well as from prevention of short circuit between electrodes (specifically short circuit between the foil and a counter electrode and short circuit between semiconductor functional layers) due to suppression of formation of the convex parts. In particular, in the electrode foil of the present invention, since light scattering effect is attained by the surface profile itself of the metal foil or the electrode foil, deterioration of productivity and cost effectiveness can be avoided without necessitating microlens formation and microfabrication associated therewith, and therefore the electrode foil is also suitable for enlargement of area. The preferable Pv/Pp ratio is 2.3 or higher, more preferably 2.5 or higher, further preferably 2.8 or higher, most preferably 3.0 or higher. The maximum profile peak height Pp and the maximum profile valley depth Pv may be measured in accordance with JIS B 0601-2001 by using a commercially available contactless surface shape measuring machine.

"The light-scattering surface of the electrode foil 10" described herein denotes the surface of the metal foil 12 in the case of the one-layer structure, or the surface of the reflective layer 13 or the buffer layer 14 located outmost in the case of the multi-layer structure comprising the reflective layer 13 or the buffer layer 14. The aforementioned Pv/Pp ratio in the case of such a multi-layer structure may be attained by providing the surface 12a of the metal foil 12 for the reflective layer 13 and/or the buffer layer 14 to be formed thereon with a Pv/Pp ratio in a range similar to those mentioned above, namely, 2.0 or higher, preferably 2.3 or higher, more preferably 2.5 or higher, further preferably 2.8 or higher, particularly preferably 3.0 or higher, most preferably 3.3 or higher; and then forming thereon the reflective layer 13 and/or the buffer layer 14. As described above, it is preferred that the surface of a layer or foil underneath the outermost surface be provided with a Pv/Pp ratio equivalent to or somewhat higher than an arithmetic average roughness Pv/Pp ratio to be provided on the outermost surface. The Pv/Pp ratio of the metal foil surface not constituting the outermost surface due to the lamination state may be evaluated by creating a cross section from the metal foil surface by FIB (Focused Ion Beam) processing; and observing the cross section with a transmission electron microscope (TEM). The Pv/Pp ratio of the reflective layer surface not constituting the outermost surface due to the lamination state may be evaluated in the same way.

The light-scattering surface of the electrode foil 10 preferably has a countless number of concave parts having depths of 1 μm or less (typically from 0.1 μm to 1 μm) and major axis diameters of 100 μm or less (typically from 1 μm to 100 μm), thereby substantially removing convex parts to attain a significantly high Pv/Pp ratio. When the depth is less than 1 μm, a semiconductor functional layer formed on the light-scattering surface may be more reliably supported. In addition, when the major axis diameter is 1 μm or more, light scattering effect is easily attained. The number of the concave parts is preferably 200 or less (typically from 1 to 200) within an area of 10,000 μm$^2$.

In the present invention, using the metal foil 12 not only as a supporting base material but also as an electrode makes it possible to provide an electrode foil which combines functions as a supporting base material and an electrode. Moreover, controlling the thickness of the metal foil 12 between 1 μm and 250 μm makes it possible to use the metal foil as an electrode combined with a supporting base material for flexible electronic devices. With reference to the production of the flexible electronic devices, the electrode foil 12 of the present invention is metal-foil based, so that the electrode foil can be produced efficiently, for example, by roll-to-roll process without particularly necessitating a supporting base material. Roll-to-roll process, which comprises the steps of reeling off a long foil wound up into a roll and carrying out a predetermined process before re-rolling up the foil, is a extremely advantageous process for effectively mass-producing electronic devices and a key process to achieve mass production of the electronic device, such as a light-emitting element, a photo-electric element and the like, which is an application of the present invention. As described above, the electrode foil of the present invention makes it possible to dispense with a supporting base material and a reflective layer. Accordingly, the electrode foil of the present invention is preferably free from an insulator layer at least at the position where the electronic device is constructed, and more preferably is free from an insulator layer at any position.

The metal foil 12 is not particularly limited as long as the metal foil is a foil-like metallic material that has a strength required for a supporting base material and electrical properties required for an electrode. A preferred metal foil is a nonmagnetic metal foil from the view point of preventing magnetic adherence of particles produced on machining. Examples of the nonmagnetic metal preferably include copper, aluminum, nonmagnetic stainless steel, titanium, tantalum, and molybdenum, and more preferably copper, aluminum, and nonmagnetic stainless steel. The most preferable metal foil is copper foil. Copper foil is relatively inexpensive as well as excellent in strength, flexibility, and electrical properties.

The light-scattering surface of the electrode foil 10 is preferably an ultra-smooth surface having an arithmetic average roughness Ra of 60.0 nm or less, more preferably 30.0 nm or less, further preferably 20.0 nm or less, particularly preferably 10.0 nm or less, more particularly preferably 7.0 nm or less, and the roughness may be adequately determined depending on applications and performances required for the electrode foil. The lower limit of the arithmetic average roughness Ra is not particularly limited but may be 0 (zero). However, considering efficiency of surface smoothing treatment, 0.5 nm may be considered as the standard of the lower limit. The arithmetic average roughness Ra may be measured in accordance with JIS B 0601-2001 by using a commercially available surface roughness meter.

As described above, "the light-scattering surface of the electrode foil 10" denotes the surface of the metal foil 12 in the case of the one-layer structure, or the surface of the reflective layer 13 or the buffer layer 14 located outmost in the case of the multi-layer structure comprising the reflective layer 13 or the buffer layer 14. The aforementioned arithmetic average roughness Ra in the case of such a multi-layer structure may be attained by providing the surface 12a of the metal foil 12 for the reflective layer 13 and/or the buffer layer 14 to be formed thereon with an arithmetic average roughness Ra in a range similar to those mentioned above, namely, 60.0 nm or less, preferably 30.0 nm or less, more preferably 20.0 nm or less, further preferably 10.0 nm or less, particularly preferably 7.0 nm or less, most preferably 5.0 nm or less; and forming the reflective layer 13 and/or the buffer layer 14 thereon. As described above, it is preferred that the surface of a layer or foil underneath the outermost surface be provided with an arithmetic average roughness Ra equivalent to or somewhat smaller than an arithmetic average roughness Ra to be provided on the outermost surface. The arithmetic average roughness Ra of the metal foil surface not constituting the outermost surface due to the lamination state may be evaluated by creating a cross section from the metal foil surface by FIB (Focused Ion Beam) processing; and observing the cross section with a transmission electron microscope (TEM). The arithmetic average roughness Ra of the reflective layer surface not constituting the outermost surface due to the lamination state may be evaluated in the same way.

The extremely small arithmetic average roughness Ra of the light-scattering surface of the electrode foil 10 as described above enables more effective prevention of short circuit between electrodes when the foil is used for an electronic device, such as a light-emitting element and a photoelectric element. Such an ultra-smooth surface may be attained by polishing the metal foil with CMP (Chemical Mechanical Polishing) treatment. CMP treatment may be performed by using a known polishing liquid and a known polishing pad under known conditions. A preferable polishing liquid may comprises one or more of polishing granules selected from ceria, silica, alumina, zirconia, and others in an amount of from about 0.1 to about 10 wt %; a rust preventing agent such as benzotriazole (BTA); and/or an organic complex forming agent such as quinaldic acid, quinolinic acid, nicotinic acid, malic acid, amino acid, citric acid, carboxylic acid and polyacrylic acid; a surfactant such as a cationic surfactant and an anionic surfactant; and optionally an anti-corrosive agent. A preferable polishing pad is a pad made of urethane. The polishing conditions are not particularly limited as pad rotation speed, work load, coating flow rate of polishing liquid may be adequately regulated. It is preferable that the rotation speed be regulated in the range of from 20 rpm to 1,000 rpm, that the work load be regulated in the range of from 100 gf/cm$^2$ to 500 gf/cm$^2$, and that a coating flow rate of the polishing liquid be regulated in the range of from 20 cc/min to 200 cc/min.

The ultra-smooth surface 12a of the metal foil 12 may be attained by polishing the metal foil 12 using electrolytic polishing, buff polishing, chemical polishing, or a combination thereof. Chemical polishing is not particularly limited as it may be performed by adequately adjusting a chemical polishing solution, the temperature of the chemical polishing solution, dipping time in the chemical polishing solution, and the like. For instance, chemical polishing of copper foil may be performed by using a mixture of 2-aminoethanol and ammonium chloride. The temperature of the chemical polishing solution is preferably room temperature, while dipping method (Dip process) is preferably used. Further, dipping time in the chemical polishing solution is preferred to be from 10 to 120 seconds, more preferably from 30 to 90 seconds since long dipping time tends to result in degradation of smoothness. The metal foil after chemical polishing is preferred to be cleansed with running water. This smoothing treatment can smooth the surface having an arithmetic average roughness Ra of about 12 nm to have an Ra of 10.0 nm or less, for example about 3.0 nm.

The ultra-smooth surface 12a may also be attained by a technique such as a method of polishing the surface of the metal foil 12 by blasting or a method of melting the surface of the metal foil 12 by laser, resistance heating, lamp heating or the like and then rapidly cooling the surface of the metal foil 12.

In the meantime, since the concave part(s) and the convex part(s) are formed almost equivalently, it is usually unlikely that the ultra-smooth surface 12a attained as described above has the Pv/Pp ratio of 2.0 or higher. Thus treatment(s) to provide the Pv/Pp ratio 2.0 or higher to the ultra-smooth surface 12a may be preferably performed. Preferable examples of the surface treatment include an ultrasonic cleansing, a chemical polishing using a chemical polishing liquid and/or a dry-ice blasting method. The ultrasonic cleansing may be performed, for example, using a commercially available running water-type ultrasonic cleansing machine, by treating the metal foil surface with a predetermined high frequency output (e.g. 60 W) for a predetermined time (e.g. 10 minutes). The chemical polishing may be performed, for example, using a chemical polishing liquid (e.g. a polishing liquid for pure copper such as CPB-10, manufactured by MITSUBISHI GAS CHEMICAL COMPANY, INC), by mixing the polishing liquid with water at a predetermined proportion (e.g. a weight proportion of 1:2) before immersing at room temperature for 1 minute and by performing cleansing with pure water, cleansing with dilute sulfuric acid (e.g. 0.1 N dilute sulfuric acid), cleansing with pure water once again and drying. The dry-ice blasting method may be performed, for example, using a commercially available apparatus such as a dry-ice snow system (manufactured by AIR WATER INC.), by ejecting carbon dioxide gas compressed at high pressure through a fine nozzle and thereby blowing carbon dioxide solidified at low temperature against the ultra-smooth surface 12a. At the stage of electrodeposition of an electrolytic copper foil, a surface profile of the electrolytic copper foil may be controlled by adequately adjusting the presence or absence and the quantity of addition of organic substance, chlorine or the like. In this case, depending on the surface smoothness of the obtained metal foil, a post-treatment (e.g. the ultrasonic cleansing, the chemical polishing, the dry-ice blasting treatment, the CMP treatment and the like) should be adequately selected.

The thickness of the metal foil 12 is not particularly limited as long as the metal foil does not lose flexibility and can be handled solely in itself, but may be in the range of from 1 μm to 250 μm, preferably from 5 μm to 200 μm, more preferably from 10 μm to 150 μm, and further preferably from 15 μm to 100 μm. However the thickness may be adequately determined depending on applications and performances required for the electrode foil. Thus, if reduction in metal usage and weight saving are strongly desired, the upper limit of the thickness is particularly preferably 50 μm, 35 μm or 25 μm, and if strength is strongly desired, the lower limit of the thickness is particularly preferably 25 μm, 35 μm or 50 μm. With such thickness, cutting may be performed easily by using a commercially available cutting machine. In addition, unlike glass substrates, the metal foil 12 has no problems such as crack, chip or the like, and also has an advantage of not easily producing particles upon cutting. The metal foil 12 may be formed in various shapes other than tetragon, such as circle, triangle, and polygon, and can also be cut-and-pasted to prepare an electronic device in a three-dimensional shape such as a cubic shape or a ball shape since the metal foil is capable of being cut or welded. In this case, it is preferred that a semiconductor functional layer be not formed at a cutting or welding portion of the metal foil 12.

The ultra-smooth surface 12a is preferably cleansed with an alkaline solution. A known alkaline solution such as an ammonia-containing solution, a sodium hydroxide solution, and a potassium hydroxide solution may be used as the alkaline solution. The alkaline solution is preferably an ammonia-containing solution, more preferably an organic alkaline solution containing ammonia, further preferably a tetramethylammonium hydroxide (TMAH) solution. Preferable concentration of the TMAH solution is from 0.1 wt % to 3.0 wt %. An example of washing described above includes performing cleansing at 23° C. for one minute with use of a 0.4% TMAH solution. A similar cleansing effect can also be attained by performing UV (Ultra Violet) treatment in combination with or in place of cleansing with the alkaline solution. In addition, in the case of copper foil and the like, it is possible to remove oxides formed on the copper surface by using an acidic cleansing solution such as dilute sulfuric acid. An example of acid cleansing includes performing cleansing for 30 seconds with dilute sulfuric acid.

It is preferred that particles on the ultra-smooth surface 12a be removed. Examples of an effective method for removing the particles include a sonic washing method using ultra-pure water and a dry-ice blasting method. The dry-ice blasting method is more effective. Dry-ice blasting method is a method of ejecting carbon dioxide gas compressed at high pressure through a fine nozzle and thereby blowing carbon dioxide solidified at low temperature against the ultra-smooth surface 12a to remove the particles. Unlike wet process, this dry-ice blasting method can dispense with drying process, and also has an advantage of being able to remove organic substances. The dry-ice blasting method may be performed by using a commercially available apparatus such as a dry-ice snow system (manufactured by AIR WATER INC.). Nonetheless, when the particles have been already removed by the treatment(s) to provide the Pv/Pp ratio 2.0 or higher to the ultra-smooth surface 12a (e.g. the dry-ice blasting method), this particle removal process is omissible.

Optionally, the reflective layer 13 is provided directly on the ultra-smooth surface of the metal foil 12, or thereabove via a diffusion prevention layer described hereinafter. The reflective layer 13 is preferred to be composed of at least one selected from the group consisting of aluminum, aluminum alloys, silver, and silver alloys. These materials are suitable for a reflective layer due to a high optical reflectivity and also excellent in smoothness when being formed into thin films. In particular, aluminum and aluminum alloys are preferable, because they are inexpensive materials. A wide variety of aluminum alloys and silver alloys can be adopted that have general alloy compositions for use as an anode or a cathode of a display device in a light-emitting element or a photo-electric element. Preferred examples of the aluminum alloy compositions include Al—Ni; Al—Cu; Al—Ag; Al—Ce; Al—Zn; Al—B; Al—Ta; Al—Nd; Al—Si; Al—La; Al—Co; Al—Ge; Al—Fe; Al—Li; Al—Mg; and Al—Mn. Any element that can constitute these alloys may be combined arbitrarily, depending on required performances. Preferred examples of the silver alloy compositions include Ag—Pd; Ag—Cu; Ag—Al; Ag—Zn; Ag—Mg; Ag—Mn; Ag—Cr; Ag—Ti; Ag—Ta; Ag—Co; Ag—Si; Ag—Ge; Ag—Li; Ag—B; Ag—Pt; Ag—Fe; Ag—Nd; Ag—La; and Ag—Ce. Any element that can constitute these alloys may be combined arbitrarily, depending on required performances. The thickness of the reflective layer 13 is not particularly limited, but is preferably from 30 nm to 500 nm, more preferably from 50 nm to 300 nm, and further preferably from 100 nm to 250 nm.

When the reflective layer 13 is composed of an aluminum film or an aluminum alloy film, the reflective layer may be composed of a laminate structure comprising at least two layers. In this embodiment, the reflective layer 13 has a laminate structure of two layers that are separated from each other by an interface, across which the lower layer and the upper layer have crystal orientations different from each other. As a result, even when the electrode foil is exposed to a considerably high temperature, thermal migration that may occur from the interface between the copper foil and the aluminum-containing reflective layer can be effectively suppressed, making it possible to prevent deterioration of the surface smoothness and optical reflectivity caused by the thermal migration. That is, heat resistance of the electrode foil can be improved. Therefore, the above embodiment is particularly effective in heat treatment which is performed at a temperature of 200° C. or higher, preferably 230° C. or higher, and more preferably 250° C. or higher after a hole injection layer is coated. The above improvement in heat resistance is considered to be attained in a way that thermal migration that proceeds preferentially in crystal boundaries is prevented by the interface at which the crystal boundaries discontinue. The number of the interface in the reflective layer may be two or more, which means that the reflective layer is a layer structure of three or more layers.

The reflective layer of the laminate structure may be prepared by performing a film-forming process such as sputtering a plurality of times with a predetermined interval. Preferred examples of such process are shown below.

(1) Film forming of the lower layer is performed by sputtering until the film thickness becomes preferably 10 nm or more, and then the sputtering is temporarily suspended. The lower layer is left as it is in a chamber of a sputtering apparatus. The duration of being left in the chamber is preferred to be 30 seconds or more. Sputtering is then restarted to perform film forming of the upper layer.

(2) Film forming of the lower layer is performed by sputtering until the film thickness becomes preferably 10 nm or more, and then the sputtering is temporarily suspended. The lower layer is then brought into contact with the air. In the contact with the air, a metal foil on which the lower layer is formed may be taken out of the chamber of the sputtering apparatus and exposed to the air or, alternatively, the chamber is vented to the air without taking out the metal foil. Sputtering is then restarted to perform film forming of the upper layer. Exposing the lower layer to the air for several seconds is sufficient. A desired effect can be attained at a temperature and a humidity as provided in conventional clean room atmosphere.

(3) Film forming of the lower layer is performed by sputtering until the film thickness becomes preferably 10 nm or more, and then the sputtering is temporarily suspended. Oxygen is introduced into the chamber of the sputtering apparatus so as to create an oxygen atmosphere. Thereafter, evacuation is restarted, and film forming of the upper layer is performed. The pressure in the chamber into which oxygen is introduced is preferably 0.01 Pa or more, more preferably 0.1 Pa or more, and further preferably 1 Pa or more.

In the case of the reflective layer having a layer structure, one interface is sufficient. Even if the reflective layer has one interface, sufficient heat resistance is exhibited under high temperature of around 250° C. Nonetheless, by increasing the number of film formation processes to provide two or more interfaces, the heat resistance may be further improved.

Any films having known compositions and structures can be used as a diffusion prevention layer optionally provided between the metal foil 12 and the reflective layer 13 as long as it has a function of preventing diffusion of metal derived from the metal foil. As a result, even when the electrode foil is exposed to a considerably high temperature, thermal migration that may occur from the interface between the copper foil and the aluminum-containing reflective layer can be effectively suppressed, making it possible to prevent deterioration of the surface smoothness and optical reflectivity caused by the thermal migration. That is, heat resistance of the electrode foil can be improved. Therefore, the above embodiment is particularly effective in heat treatment which is performed at a temperature of 200° C. or higher, preferably 230° C. or higher, and more preferably 250° C. or higher after a hole injection layer is coated. The diffusion prevention layer may be a layer structure composed of two or more layers.

Preferable materials for constituting the diffusion prevention layer include (i) high-melting metals such as Mo, Ti, Ta, Cr and W, alloys and nitrides thereof; (ii) transition metals such as Ni, Fe, Co and alloys thereof; and (iii) an conductive amorphous carbon, an conductive oxide, a magnesium alloy, and a fluoride, which can also be used for the buffer layer. Therefore, examples of the diffusion prevention layer include layers comprising at least one of Mo, Ti, Ta, Cr, W, Ni, Fe, Co, C, Zn, Li, Y, indium oxide, tin oxide, zinc oxide, molybdenum oxide, gallium oxide, vanadium oxide, tungsten oxide, ruthenium oxide, aluminum oxide, titanium oxide, titanium nitride, chromium nitride, tantalum nitride, NiP, Ni—Zn, LiF, $MgF_2$, $CaF_3$, $NaAlF_6$, and $NaF_6$. In addition, these compounds are not limited to those having stoichiometric compositions. For example, a substance such as indium oxide $(In_2O_3)$ partially devoid of oxygen can also be used as the diffusion prevention layer. This makes it possible to effectively prevent thermal migration, while bringing the metal foil 12 into close contact with the reflective layer 13 electrically and mechanically. Formation of the diffusion layer may be done in accordance with various known methods such as sputtering method, vacuum deposition method, electroplating method, non-electrolytic plating method and the like. The thickness of the diffusion prevention layer is not limited as long as there can be achieved the effect of preventing diffusion of metal as required for the diffusion prevention layer, but is preferred to be 1 nm or more, more preferably 3 nm or more, further preferably 5 nm or more. In addition, in terms of retaining the surface smoothness of the electrode foil, the thickness of the diffusion prevention layer is preferred to be 200 nm or less, more preferably 100 nm or less.

Preferably, the buffer layer 14 is directly provided on the outermost surface of at least one of the metal foil 12 and, if present, the reflective layer 13, with the surface of the buffer layer constituting the light-scattering surface. In the case of the light-emitting element or the photo-electric element, the buffer layer 14 is not particularly limited as long as it makes contact with a semiconductor functional layer to provide a desired work function. The buffer layer in the present invention is preferably transparent or translucent to sufficiently ensure light scattering effect.

The buffer layer 14 is preferably at least one selected from the group consisting of an conductive amorphous carbon film, an conductive oxide film, a magnesium alloy film, and a fluoride film, and may be selected as needed depending on applications such as an anode or a cathode of the electronic device and required performances.

As the conductive amorphous carbon film, various kinds of amorphous carbon films provided with electrical conductivity by regulating hydrogen concentration or impurity concentration may be used. Formation of the conductive amorphous carbon film is preferred to be conducted by sputtering. A carbon target subjected to purification treatment is desired to be used for the sputtering. In addition, porous carbon impregnated with B, Si, Al or Cu may be used. When the conductive amorphous carbon film is used as the buffer layer, any of an aluminum film, an aluminum alloy film, a silver film, and a silver alloy film may be suitably used for the reflective layer, while aluminum alloys are preferable in consideration of smoothness and material cost.

A preferable conductive amorphous carbon film is composed of a conductive amorphous carbon having a hydrogen concentration of 15 at % or less. The hydrogen concentration is more preferably 12 at % or less and further preferably 5 at % or less. Although the lower limit of the hydrogen concentration is not particularly limited but may be 0 (zero), a typical lower limit may be 3 at % in consideration of unavoidable contamination with hydrogen from film forming environment upon sputtering. The hydrogen concentration in the buffer layer may be measured by various known methods, among which HFS (Hydrogen Forward Scattering) is preferred. The hydrogen concentration in the conductive amorphous carbon film is defined herein as a hydrogen concentration obtained by measuring the amounts of carbon and hydrogen by HFS or the like and assuming the total amount of these atoms as 100 at %. Extremely lowering the hydrogen concentration in this way makes it possible to avoid decrease in electrical conductivity or development of insulation properties, which are caused by the carbon atoms constituting the buffer layer being terminated with hydrogen, and thus to provide the buffer layer with a high electrical conductivity required for an electrode. Therefore, it is preferable that the conductive amorphous carbon be not substantially doped with impurities other than carbon and hydrogen. The phrase "not substantially doped" means that impurities are not intentionally added for the purpose of providing a certain function, allowing impurities unavoidably incorporated from film forming environment or the like during sputtering. In view of this, the conductive amorphous carbon in the present invention preferably has an oxygen concentration of from 0 wtppm to 300 wtppm, a halogen element concentration of from 0 wtppm to 1,000 wtppm, and a nitrogen concentration of from 0 wtppm to 500 wtppm. The thickness of the buffer layer 14 is not particularly limited, but preferably from 3 nm to 30 nm, more preferably from 3 nm to 15 nm, and further preferably from 5 nm to 10 nm.

A preferable conductive oxide film may be composed of one or more selected from the group consisting of $InO_x$, $SnO_x$, $ZnO_x$, $MoO_x$, $GaO_x$, $VO_x$, $WO_x$, $RuO_x$, $AlO_x$, $TiO_x$, and $GeO_x$. Typical examples thereof include ITO (indium tin oxide) and IZO (indium zinc oxide). The conductive oxide film may be formed by using a known technique such as sputtering and vacuum deposition, preferably DC magnetron sputtering. The target material used for sputtering may be prepared by hot pressing or cold pressing, so that the oxides described above may be combined together as needed to attain desired characteristics. When the conductive oxide film is used as the buffer layer, Al—Ni alloys, Ag, or Ag alloy are particularly suitable for the reflective layer.

A preferable magnesium alloy film may be composed of an alloy comprising Mg and one or more additive selected from the group consisting of Ag, Al, Zn, Li, Y, and Ca. The magnesium alloy film may be formed by using a known technique such as sputtering method or vacuum deposition method, preferably vacuum deposition method.

A preferable fluoride film may be composed of one or more selected from the group consisting of LiF, $MgF_2$, $CaF_2$, $AlF_3$, $Na_3AlF_6$, and $NaF_6$. The fluoride film may be formed by using a known technique such as sputtering method or vacuum deposition method, preferably vacuum deposition method.

An oxide film (not shown in figures) may exist between the reflective layer 13 and the buffer layer 14. The oxide film may be formed typically by allowing the anode layer to be inevitably oxidized by atmospheric oxygen. The oxide film is preferred to be as thin as possible, with a thickness being preferably 3.0 nm or less, more preferably 1.5 nm or less. The oxide film may be removed by etching or the like.

The thickness of the electrode foil according to the present invention is preferably in the range of from 1 μm to 300 μm, more preferably from 1 μm to 250 μm, further preferably from 5 μm to 200 μm, particularly preferably from 10 μm to 150 μm and most preferably from 15 μm to 100 μm, but the thickness may be adequately determined depending on applications and performances required for the electrode foil. Thus, if reduction in metal usage and weight saving are strongly desired, the upper limit of the thickness is particularly preferably 50 μm, 35 μm or 25 μm, and if strength is strongly desired, the lower limit of the thickness is particularly preferably 25 μm, 35 μm or 50 μm. All the thickness of the electrode foil is similar to the aforementioned thickness of metal foil 12. This is because the thickness of the reflective layer 13 and/or the buffer layer 14 which may be formed on the metal foil 12 are generally negligibly-small in comparison with the thickness of the metal foil 12.

The electrode foil according to the present invention may be used preferably as an electrode for various kinds of electronic devices (i.e. an anode or a cathode). The electrode foil of the present invention is generally easily bendable with small stress and thus is particularly preferred to be used as an electrode for flexible electronic devices, although it may also be used for electronic devices with inferior flexibility or with rigidity. Examples of such electronic devices (mainly flexible electronic devices) include i) light-emitting elements such as organic EL elements; organic EL lighting; organic EL displays; electronic paper; liquid crystal displays; inorganic EL elements; inorganic EL displays; LED lighting; and LED displays, and II) photo-electric elements such as thin-film solar cells. Preferred are organic EL elements, organic EL lighting, organic EL displays, organic solar cells, and dye-sensitized solar cells. Organic EL lighting is more preferable in that high brightness is attained in an ultra-thin form. In addition, since many of characteristics required for electrode materials of organic solar cells are in common with those required for organic EL elements, the electrode foil of the present invention may be preferably used as an anode or a cathode of organic solar cells. Namely, appropriate selection of the kind of an organic semiconductor functional layer to be laminated on the electrode foil of the present invention in accordance with known techniques makes it possible to construct an organic device in any form of an organic EL element and an organic solar cell.

The both surfaces of the electrode foil according to the present invention may be constructed as the light-scattering surface. This is advantageous for providing the electronic devices on the both surfaces of the electrode foil, and thereby a double-sided functional element or a double-sided functional element foil comprising the electronic devices on the both surfaces can be provided. It is also possible to form a light-emitting element on one surface and a power generating element on the other surface in the same electrode, and thereby to fabricate a non-conventional composite electronic device that has both functions of an organic EL element and an organic solar cell. Furthermore, the electrode foil of the present invention may be used not only as an electrode of an organic EL element but also as an LED mounting board. In particular, the electrode foil of the present invention may be preferably used as an anode or a cathode of LED lighting in that LED elements can be mounted in a closely packed manner.

The length of the electrode foil according to the present invention is not particularly limited, but, to apply roll-to-roll process to the electrode foil, the electrode foil preferably has some length. The preferable length of the electrode foil, which differs depending on specifications of an apparatus and the like, is generally 2 m or more, more preferably from the viewpoint of productivity improvement 20 m or more, further preferably 50 m or more, particularly preferably 100 m or more and most preferably 1000 m or more. Furthermore, the preferable width of the electrode foil, which differs depending on specifications of an apparatus and the like, is generally 150 mm or more, preferably from the viewpoint of productivity improvement 350 mm or more, more preferably 600 mm or more and particularly preferably 1000 mm or more. In the embodiment, in which the both surfaces of the electrode foil are constructed as the light-scattering surface, since formation of the convex parts is inhibited on the both surfaces, flaw which may be caused by winding can be effectively prevented. Namely, for prevention of flaw caused by winding, it is effective to put a material with an elasticity higher than the electrode foil, such as a film, an embossed film or the like, between the surface and the back side, but because a separate step of rolling up the interlaminar material is needed before passing to the next step and the like, the handling becomes complicated. In this respect, the electrode foil of which both surfaces are constructed as the light-scattering surface can prevent flaw caused by winding without putting such a material.

Electronic Devices

By using the electrode foil according to the present invention, there can be provided an electronic device comprising a semiconductor functional layer with semiconductor properties on a light-scattering surface of the electrode foil. The semiconductor functional layer is preferably formed directly on the light-scattering surface. While the semiconductor functional layer may have any structure and material as long as it is a layer with semiconductor properties that can develop a desired function on electrode or between electrodes, a semiconductor functional layer comprising an organic semiconductor, an inorganic semiconductor, or mixture or combination thereof is preferred. For example, the semiconductor functional layer has a function of excitation light-emission or photoexcitation power generation, and thereby the electronic device preferably functions as a light-emitting element or a photo-electric element. Furthermore, in the case of the light-emitting element and the photo-electric element, a transparent or translucent counter electrode is preferably provided on the semiconductor functional layer. When the semiconductor functional layer is formed, to the electrode foil of the present invention, a process of dissolving high molecular material or low molecular material in a solvent such as chlorobenzene before coating is preferably applicable, and in-line type vacuum process is also applicable. Therefore the electrode foil of the present invention is suitable for improvement of the productivity.

The semiconductor functional layer may be provided on the both surfaces of the electrode foil. According to a preferred embodiment of the present invention, the semiconductor functional layer is provided directly on the light-scattering surface at both sides of the electrode foil and one semiconductor functional layer can have the same function as the other semiconductor functional layer. By providing the structure having the same function on the both surfaces of the electrode foil, greater functional advancement can be expected than the case where the function is provided on only one side. In the case of the light-emitting element, light can be omnidirectionally emitted, and in the case of the photo-electric element, higher voltage can be obtained. According to another preferred embodiment of the present invention, the semiconductor functional layer is provided directly on the light-scattering surface at both sides of the electrode foil, and one semiconductor functional layer and the other semiconductor functional layer may have different functions from each other. By providing such a structure having different functions on each surface of the electrode foil, an element that has different functions at the front side and the back side (e.g. indoor side and outdoor side) can be fabricated. For example, by forming a light-emitting element on one surface and a power generating element on the other surface in the same electrode, a non-conventional composite electronic device that has both functions of an organic EL element and an organic solar cell is provided.

(1) Organic EL Elements and Organic EL Lighting

Using the electrode foil of the present invention as a reflective electrode makes it possible to construct a light-emitting and an organic EL lighting element comprising a top-emission type organic EL element on the light-scattering surface.

Figure 2:
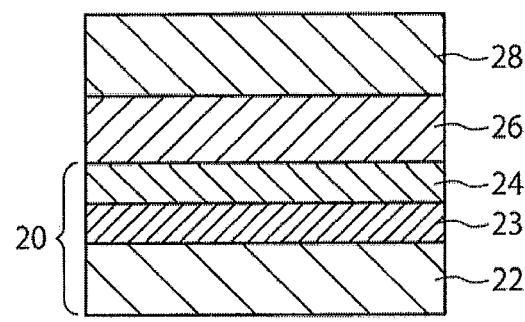
FIG. 2 is a schematic cross-sectional view illustrating an example of an organic EL element in which the electrode foil according to the present invention is used as an anode.

FIG. 2 shows an example of a layer structure of a top-emission type organic EL element that uses the electrode foil of the present invention as an anode. The organic EL element shown in FIG. 2 comprises an electrode foil 20 as an anode comprising a metal foil 22, a reflective layer 23 and optionally a buffer layer 24; an organic EL layer 26 provided directly on the surface of the buffer layer 24; and a cathode 28 as a photic electrode provided directly on the surface of the organic EL layer 26. It is preferred that the buffer layer 24 be composed of a conductive amorphous carbon film or a conductive oxide film so as to be suitable as an anode.

The organic EL layer 26 may employ various known EL layer structures used for organic EL elements and may comprise optionally a hole injection layer and/or a hole transport layer, a light-emitting layer, and optionally an electron transport layer and/or an electron injection layer in this order in the direction from the anodic electrode foil 20 to the cathode 28. Any various known structures or compositions may be appropriately employed for each of the hole injection layer, the hole transport layer, the light-emitting layer, the electron transport layer, and the electron injection layer, without any particular limitation.

Figure 3:
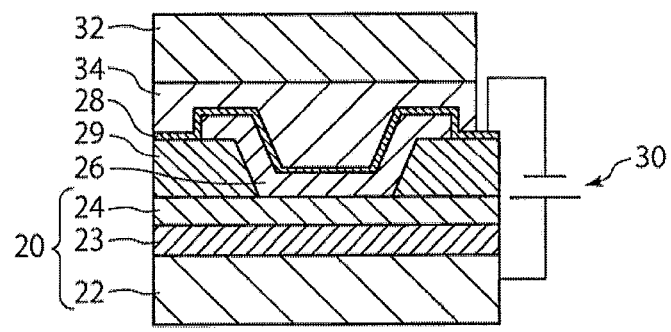
FIG. 3 is a schematic cross-sectional view illustrating an example of a top-emission type organic EL lighting according to the present invention.

FIG. 3 shows an example of a layer structure of a top-emission type organic EL lighting in which an organic EL element shown in FIG. 2 is incorporated. In the organic EL lighting shown in FIG. 3, the organic EL element is electrically connectable with a power source 30 through the metal foil 22 of the anodic electrode foil 20. On the surface of the buffer layer 24, the area that has no contact with the organic EL layer 26 is covered with an interlayer insulation film 29. The interlayer insulation film 29 is preferred to be a Si-based insulation film formed by CVD in that the film has a high barrier performance against water and oxygen that cause degradation of organic layers. A SiN-based insulation film is more preferable. A still more preferable interlayer insulation film is a SiNO-based insulation film in that the film has a small internal stress and an excellent bending performance.

Above the cathode 28, a sealing material 32 is provided as opposed to the organic EL element. The gap between the sealing material 32 and the cathode 28 is filled with a sealing resin to form a sealing film 34. As the sealing material 32, glass or films may be used. In the case of glass, the sealing material 32 may be bonded directly onto the sealing film 34 using a hydrophobic adhesive tape. In the case of films, both surfaces and end faces thereof may be covered with a Si-based insulating film. When a film having a high barrier performance will be developed in future, sealing will be possible without conducting coating treatment, and is expected to provide superior mass productivity. As the sealing material 32, films are preferable in terms of imparting flexibility. Nonetheless, a desired performance may be attained by using a sealing material in which a film is adhered to an extremely thin glass having a thickness of from 20 μm to 100 μm.

While various known cathodes used for top-emission type organic EL elements may be used as the cathode 28 without any particular limitation as long as they are transparent or translucent due to the necessity to transmit light, those having low work functions are preferred. Examples of preferable cathodes include conductive oxide films, magnesium alloy films, and fluoride films. A combination of two or more thereof is more preferable. For these films, films similar to those described with regard to the buffer layer of the electrode foil may be used.

A particularly preferable cathode has a two-layer structure in which a translucent metal layer as a buffer layer composed of a magnesium alloy film and/or a fluoride film is laminated onto a transparent oxide layer as a cathode layer composed of an conductive oxide film, being highly useful from the viewpoint of resistance as well. In this case, a high optical transparency and a low work function are provided by bringing the translucent metal layer (buffer layer) of the cathode 28 into contact with the organic EL layer 26, thereby enhancing brightness and power efficiency of the organic EL element. A most preferable example is a cathode structure formed by laminating a transparent oxide layer (cathode layer) composed of IZO (indium zinc oxide) and a translucent metal layer (buffer layer) composed of Mg—Ag. In addition, the cathode structure may have two or more transparent oxide layers and/or two or more translucent metal layers. Thus, the light generated in the organic EL layer 26 passes through the cathode 28, the sealing film 34, and the sealing material 32, and is then emitted outside.

On the back side of the electrode foil 20, an auxiliary substrate may be appropriately provided depending on type of usage. The portion does not affect light emission performance, so that materials may be selected with a high degree of freedom. For instance, a resin film such as polyethylene terephthalate (PET), polyimide (PI), polycarbonate (PC), polyethersulfone (PES), and polyethernitrile (PEN) may be optimally used because flexibility is not impaired.

Figure 4:
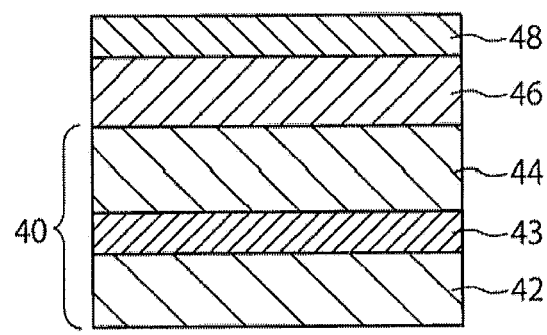
FIG. 4 is a schematic cross-sectional view illustrating an example of an organic EL element in which the electrode foil according to the present invention is used as a cathode.

FIG. 4 shows an example of a layer structure of a top-emission type organic EL element in which the electrode foil of the present invention is used as a cathode. The organic EL element shown in FIG. 4 comprises a cathodic electrode foil 40 comprising a metal foil 42, a reflective layer 43 and a buffer layer 44; an organic EL layer 46 provided directly on the surface of the buffer layer 44; and an anode 48 as a counter electrode provided directly on the surface of the organic EL layer 46. The organic EL layer 46 may be composed similarly to the organic EL layer 26 shown in FIG. 2. The buffer layer 44 may be composed similarly to the cathode 28 shown in FIG. 2, and preferably composed of a conductive oxide film, a magnesium alloy film, a fluoride film, or a combination of two or more thereof. More preferably, the buffer layer 44 is a translucent metal layer composed of a magnesium alloy film and/or a fluoride film.

Specifically, the organic EL element that uses cathodic electrode foil 40 shown in FIG. 4 corresponds to a structure in which an organic EL element using the anodic electrode foil 20 shown in FIG. 2 is modified by exchanging the buffer layer 24 and the cathode 28 and reversing the lamination order from the anode side to the cathode side inside the organic EL layer 26. For instance, it is preferable that a magnesium alloy film or a fluoride film as the buffer layer 44 of the cathodic electrode foil 40 is formed by sputtering or vapor deposition while a film made of conductive amorphous carbon, $MoO_3$, or $V_2O_5$ is formed as the anode 48 by vapor deposition. In particular, in the case of forming a conductive amorphous carbon film on the organic EL layer, vacuum deposition is preferably used in order to avoid plasma damage during sputtering.

(2) Photo-Electric Elements

Using the electrode foil of the present invention as a reflective electrode makes it possible to construct a photo-electric element on the light-scattering surface. The photo-electric element according to a preferred embodiment of the present invention comprises an electrode foil; a photoexcitation layer as a semiconductor functional layer provided directly on the surface of the electrode foil; and a photic electrode as a counter electrode provided directly on the surface of the photoexcitation layer. The photoexcitation layer may employ various structures and materials known as a semiconductor functional layer of photo-electric element.

Figure 5:
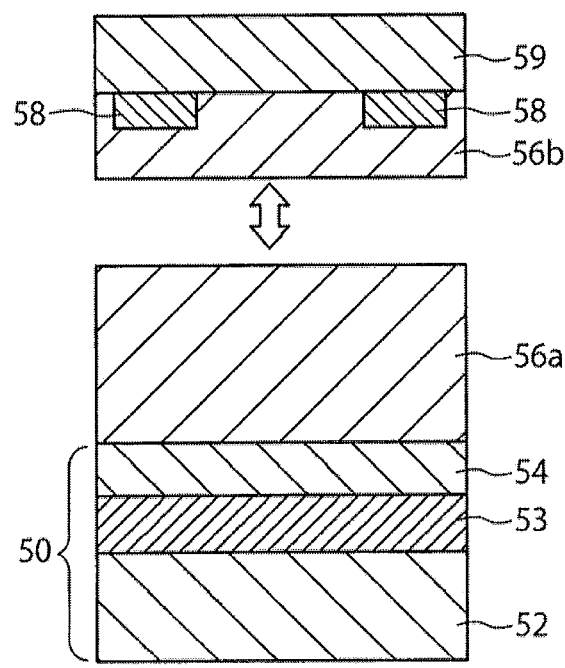
FIG. 5 is a view illustrating an example of laminating process for the photo-electric element according to the present invention.
Figure 6:
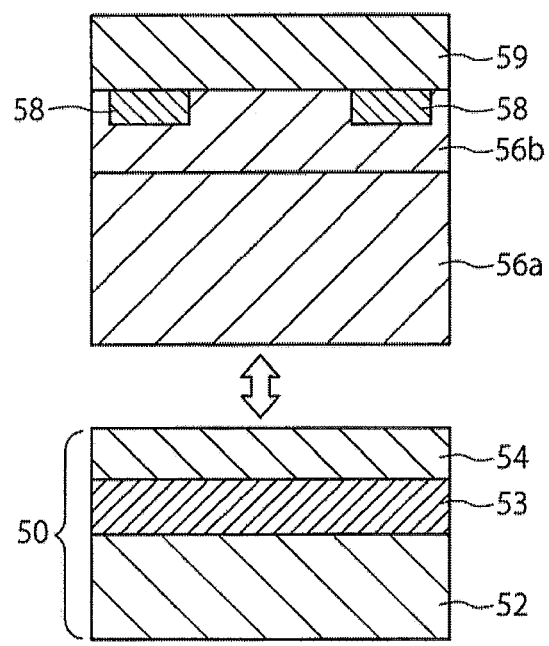
FIG. 6 is a view illustrating another example of laminating process for the photo-electric element according to the present invention.

For example, an organic solar cell may be constructed by replacing the organic EL layer 26 shown in FIG. 2 with a known organic solar cell active layer. In the case of an organic solar cell in which the electrode foil of the present invention is used as an anode, the solar cell can be constructed by laminating, on a buffer layer (for instance, a carbon buffer layer), a hole transport layer (PEDOT:PSS (30 nm)), a p-type organic semiconductor functional layer (for instance, BP (benzoporphyrin)), an i-type mixing layer (for instance, BP:PCBNB (fullerene derivative) of an n-type organic semiconductor and a p-type organic semiconductor, an n-type organic semiconductor functional layer (for instance, PCBM (fullerene derivative)), a buffer layer having a low work function (for instance, Mg—Ag), and a transparent electrode layer (for instance, IZO) in this order. Furthermore, in another example, as shown in FIGS. 5 and 6, the metal foil 52 (for instance, a copper foil) has the reflective layer 53 (for instance, an aluminum film) and the n-type semiconductor buffer layer 54 (for instance, an n-type oxide semiconductor such as ZnO, $SnO_2$, $TiO_2$, NbO, $In_2O_3$, $Ga_2O_3$ and combinations thereof), and the solar cell may be constructed by laminating, on the n-type semiconductor buffer layer 54, the blend layer 56a (for instance, P3HT:PCBM) of a p-type organic semiconductor and an n-type organic semiconductor, the hole transport layer 56b (for instance, PEDOT:PSS) and the electrode 58 in this order. Known materials may be appropriately used for each of these layers without any particular limitation. The electrode used for organic solar cells may have the same materials and structure as the electrode used for organic EL elements. The electrode foil of the present invention comprises a reflective layer and is thus expected to provide an increase in power generation efficiency due to light confinement caused by cavity effect.

As described above, the photoexcitation layer is constructed having various known functional layers, but the lamination may be conducted by forming each layer in the direction from the electrode foil to the counter electrode in order, or by preparing the first laminated part of the electrode foil side and the second laminated part of the counter electrode side separately before bonding the first and the second laminated parts together to obtain the photo-electric element comprising desired photoexcitation layer. For example, as shown in FIG. 5, while the electrode foil 50 comprising the blend layer 56a of the p-type organic semiconductor and the n-type organic semiconductor may be prepared as the first laminated part, the counter electrode 58 and the hole transport layer 56b may be formed on the resin film 59 (for instance, polyethernitrile (PEN)) as the second laminated part separately, and then the blend layer 56a and the hole transport layer 56b may be bonded together to laminate the first and the second laminated parts. Alternatively, as shown in FIG. 6, while the electrode foil 50 may be prepared as the first laminated part, the counter electrode 58, the hole transport layer 56b and the blend layer 56a of the p-type organic semiconductor and the n-type organic semiconductor may be formed on the resin film 59 (for instance, polyethernitrile (PEN)) as the second laminated part separately, and then the blend layer 56a and the hole transport layer 56b may be bonded together to laminate the first and the second laminated parts.

EXAMPLES

The present invention will be further described in detail with reference to the following examples.

Example 1

Measurement of Light Scattering Effect in the Electrode Foils with Various Pv/Pp Ratios (1) Preparation of Samples Electrode foil samples 1 to 5 with various Pv/Pp ratios were prepared. Then, measuring methods of surface properties of each sample were as follows.

(Arithmetic Average Roughness Ra)

Arithmetic average roughness Ra of each sample surface was measured with a scanning probe microscope (Nano Scope V, manufactured by Veeco Instrument Inc.) in accordance with JIS B 0601-2001. This measurement was performed in an area of 10 μm square using a Tapping Mode AFM.

(Pv/Pp Ratio)

Maximum profile valley depth Pv of profile curve to maximum profile peak height Pp of profile curve was measured with contactless surface shape measuring machine (NewView5032, manufactured by Zygo Corp.) in a rectangular area of 181 μm×136 μm in accordance with JIS B 0601-2001 to calculate Pv/Pp ratio. Then, measurement condition and filtering condition were as follows.

Lens: 50×
ImageZoom: 0.8×
Measurement area: 181×136 μm
Filter High: Auto
Filter Low: Fixed (150 μm)

(Sample 1—Comparative)

To obtain sample 1 comprising a standard reflective film for comparison, an aluminum film having a thickness of 200 nm was formed as reflective layer by sputtering on the surface of a quartz substrate having an arithmetic average roughness Ra of 0.2 nm. This sputtering was performed under the conditions of input power (DC) of 1000 W (3.1 W/cm$^2$); ultimate vacuum of lower than 5×10$^{-5}$ Pa; sputtering pressure of 0.5 Pa; Ar flow rate of 100 sccm; and substrate temperature at room temperature, after mounting an Al target with a purity of 99.99% in a magnetron sputtering apparatus (MSL-464, manufactured by Tokki Corp.) to which a cryopump was connected. The surface properties of obtained sample 1 were measured, resulting in an arithmetic average roughness Ra of 0.8 nm and Pv/Pp ratio of 1.02.

(Sample 2—Comparative)

Sample 2 having a low Pv/Pp ratio for comparison was prepared as follows. At the outset, as a metal foil, 35 μm thick commercially available electrolytic copper foil (DFF (Dual Flat Foil), manufactured by Mitsui Mining & Smelting Co., Ltd.) was provided. The arithmetic average roughness Ra of the copper foil surface was 16.5 nm. The surface of the copper foil substrate was subjected to chemical polishing with a chemical polishing liquid (CPB-10, manufactured by MITSUBISHI GAS CHEMICAL COMPANY, INC). The chemical polishing was performed by mixing the polishing liquid and water at a weight proportion of 1:2 and immersing the copper foil substrate in the diluted solution at room temperature for 1 minute. The treated copper foil substrate was cleansed with pure water before cleansed with 0.1 N dilute sulfuric acid, then cleansed with pure water once again and dried. On the polished surface, an aluminum reflective layer was formed under the same conditions as sample 1. The surface properties of obtained sample 2 were measured in the same way as sample 1, resulting in an arithmetic average roughness Ra of 19.3 nm and Pv/Pp ratio of 1.86.

(Sample 3)

Sample 3 having a Pv/Pp ratio within the present invention was prepared as follows.

At the outset, as a metal foil, 35 μm thick commercially available electrolytic copper foil (DFF (Dual Flat Foil), manufactured by Mitsui Mining & Smelting Co., Ltd.) was provided. The surface of copper foil was subjected to CMP treatment with a polishing machine manufactured by MAT Inc. This CMP treatment was performed for 40 seconds by using a polishing pad having XY grooves and a colloidal silica polishing liquid under the conditions of pad rotation speed of 30 rpm; load of 200 gf/cm$^2$; and liquid supply rate of 100 cc/min. The arithmetic average roughness Ra of the treated copper foil surface was 6.2 nm. Using a running water-type ultrasonic cleansing machine (manufactured by Honda Electronics Co., Ltd.), the copper foil surface was treated with a high frequency output of 60 W for 20 minutes. On the polished and modified surface, an aluminum reflective layer was formed under the same conditions as sample 1. The surface properties of obtained sample 3 were measured, resulting in an arithmetic average roughness Ra of 16.2 nm and Pv/Pp ratio of 2.14.

(Sample 4)

Sample 4 having a Pv/Pp ratio within the range of the present invention was prepared as follows. At the outset, as a metal foil, 35 μm thick commercially available electrolytic copper foil (DFF (Dual Flat Foil), manufactured by Mitsui Mining & Smelting Co., Ltd.) was provided. The surface of copper foil was subjected to CMP treatment with a polishing machine manufactured by MAT Inc. This CMP treatment was performed for 60 seconds by using a polishing pad having XY grooves and a colloidal silica polishing liquid under the conditions of pad rotation speed of 30 rpm; load of 200 gf/cm$^2$; and liquid supply rate of 100 cc/min. The arithmetic average roughness Ra of the treated copper foil surface was 3.1 nm. Using a running water-type ultrasonic cleansing machine (manufactured by Honda Electronics Co., Ltd.), the copper foil surface was treated with a high frequency output of 60 W for 10 minutes. On the polished and modified surface, an aluminum reflective layer was formed under the same conditions as sample 1. The surface properties of obtained sample 4 were measured, resulting in an arithmetic average roughness Ra of 6.1 nm and Pv/Pp ratio of 2.54.

(Sample 5)

Sample 5 having a Pv/Pp ratio within the range of the present invention was prepared as follows. At the outset, as a metal foil, 35 μm thick commercially available electrolytic copper foil (DFF (Dual Flat Foil), manufactured by Mitsui Mining & Smelting Co., Ltd.) was provided. The surface of copper foil was subjected to CMP treatment with a polishing machine manufactured by MAT Inc. This CMP treatment was performed for 40 seconds by using a polishing pad having XY grooves and a colloidal silica polishing liquid under the conditions of pad rotation speed of 30 rpm; load of 200 gf/cm$^2$; and liquid supply rate of 100 cc/min. The arithmetic average roughness Ra of the treated copper foil surface was 6.8 nm. Using a running water-type ultrasonic cleansing machine (manufactured by Honda Electronics Co., Ltd.), the copper foil surface was treated with a high frequency output of 60 W for 10 minutes. On the polished and modified surface, an aluminum reflective layer was formed under the same conditions as sample 1. The surface properties of obtained sample 5 were measured, resulting in an arithmetic average roughness Ra of 13.7 nm and Pv/Pp ratio of 4.9.

(2) Measurement of Light-Scattering Properties

Figure 7:
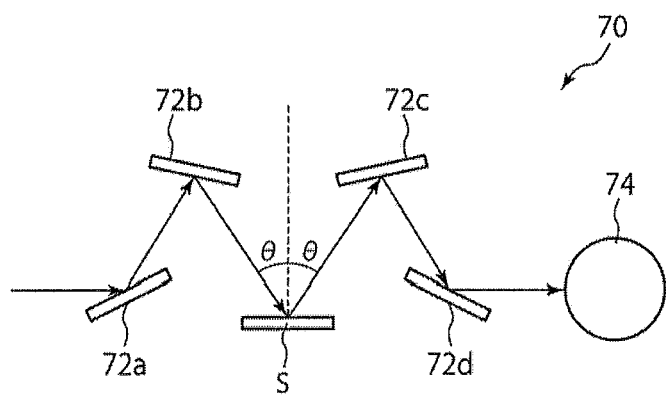
FIG. 7 is a schematic view illustrating an optical measurement system used in Example 1.

Light-scattering properties of samples 1 to 5 were measured with a spectrophotometer (U4100, manufactured by Hitachi High-Technologies Corp.). This measurement was performed, as shown in FIG. 7, by using the optical measurement system 70 comprising a plurality of mirrors 72a, 72b, 72c and 72d arranged to guide light to an integrating sphere 74, directing and reflecting light toward or against each sample S at predetermined angle θ, under the conditions of measured wavelength region of from 250 nm to 800 nm (whole visible light region) and scan speed of 300 nm/min. In the measurement system 70, the more light is scattered on sample S, the less amount of light is taken into the integrating sphere 74.

The evaluation of the light scattering effect was performed in such a way that, at each reflection angle of 10°, 30° and 60°, absolute regular reflectances of samples 2 to 5 were evaluated relatively in view of absolute regular reflectance of sample 1 that is the standard reflective film being regarded as 1. Namely, the absolute regular reflectances of samples 2 to 5 were measured and then divided by the absolute regular reflectance of the standard reflective film (sample 1) to calculate light-scattering relative values. It follows that the more light-scattering relative value is calculated, the more light scattering effect is improved. As described above, the reflective layer of each sample has the same material (aluminum coat of 99.99% purity) and substantially the same film thickness (200 nm (±5%)) so that light absorption conditions due to quality of the material or the thickness of the reflection film were the same. Furthermore, the size of the samples was 80 mm×80 mm square.

The obtained light-scattering relative values of each sample are as shown in the following Tables 1 to 3.

TABLE 1

Light-scattering relative values at reflection angle of 10°

| | | Sample number | | | | |
|---|---|---|---|---|---|---|
| | | Sample 1 (Comparative) | Sample 2 (Comparative) | Sample 3 | Sample 4 | Sample 5 |
| Pv/Pp ratio | | 1.02 | 1.86 | 2.14 | 2.54 | 4.90 |
| Measured | 700 | 1.00 | 1.03 | 1.08 | 1.14 | 1.14 |
| wavelength | 600 | 1.00 | 0.97 | 1.06 | 1.11 | 1.13 |
| (nm) | 500 | 1.00 | 1.03 | 1.10 | 1.15 | 1.17 |
| | 400 | 1.00 | 1.03 | 1.12 | 1.16 | 1.20 |
| | 380 | 1.00 | 1.04 | 1.14 | 1.16 | 1.24 |

TABLE 2

Light-scattering relative values at reflection angle of 30°

| | | Sample number | | | | |
|---|---|---|---|---|---|---|
| | | Sample 1 (Comparative) | Sample 2 (Comparative) | Sample 3 | Sample 4 | Sample 5 |
| Pv/Pp ratio | | 1.02 | 1.86 | 2.14 | 2.54 | 4.90 |
| Measured | 700 | 1.00 | 1.00 | 1.07 | 1.14 | 1.13 |
| wavelength | 600 | 1.00 | 1.00 | 1.08 | 1.11 | 1.14 |
| (nm) | 500 | 1.00 | 1.00 | 1.10 | 1.15 | 1.15 |
| | 400 | 1.00 | 1.00 | 1.10 | 1.16 | 1.20 |
| | 380 | 1.00 | 1.00 | 1.11 | 1.16 | 1.24 |

TABLE 3

Light-scattering relative values at reflection angle of 60°

| | | Sample number | | | | |
|---|---|---|---|---|---|---|
| | | Sample 1 (Comparative) | Sample 2 (Comparative) | Sample 3 | Sample 4 | Sample 5 |
| Pv/Pp ratio | | 1.02 | 1.86 | 2.14 | 2.54 | 4.90 |
| Measured | 700 | 1.00 | 1.00 | 1.02 | 1.09 | 1.11 |
| wavelength | 600 | 1.00 | 1.00 | 1.02 | 1.07 | 1.12 |
| (nm) | 500 | 1.00 | 1.00 | 1.03 | 1.08 | 1.13 |
| | 400 | 1.00 | 1.01 | 1.07 | 1.10 | 1.17 |
| | 380 | 1.00 | 1.01 | 1.08 | 1.10 | 1.18 |

As a result, in each measured reflection angle and each measured wavelength region, when Pv/Pp was 2.0 or higher, scattering effect of 0.1 or more was obtained.

Example 2

Preparation and Evaluation of Electrode Foil with Various Surface Properties

Various conditions shown in samples 2 to 5 of Example 1 were adequately changed and various electrode foils having an arithmetic average roughness Ra and a Pv/Pp ratio shown in FIG. 8 were prepared Light-scattering properties of the electrode foils were evaluated in the same way as example 1. As shown in FIG. 8, samples with a Pv/Pp ratio of 2.0 or higher exhibited improvement of 1.2 times in light-scattering properties, while no such high light scattering was attained on samples with a Pv/Pp ratio of less than 2.0. Furthermore, these electrode foils were used to prepare light-emitting elements or power generating elements, which attained desired element characteristics while avoiding short circuit with a counter electrode as shown in FIG. 8 when the Ra was 60 nm or less. Therefore, it can be understood that a surface profile having a Pv/Pp ratio of 2.0 or higher and an Ra of 60 nm or less is preferable.

Figure 10:
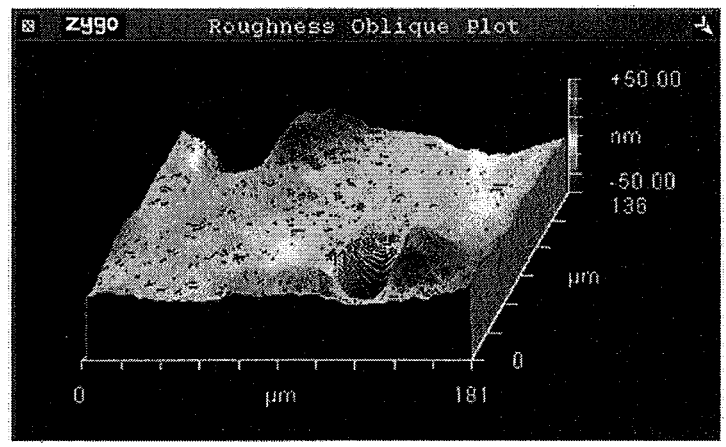
FIG. 10 is a three-dimensional surface profile of sample 6, shown in FIG. 8, obtained by measuring thereof with contactless surface shape measuring machine.
Figure 11:
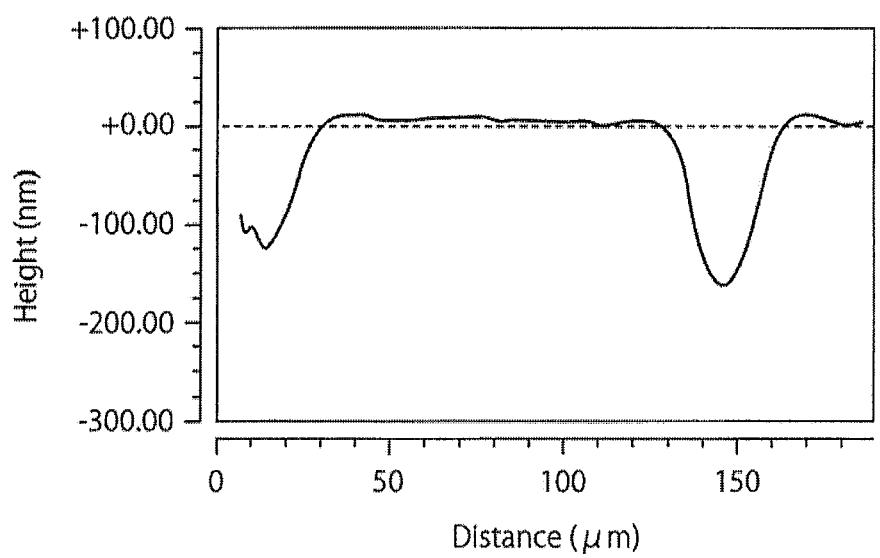
FIG. 11 is a surface profile of sample 6, shown in FIG. 8, obtained by measuring thereof with contactless surface shape measuring machine.
Figure 12:
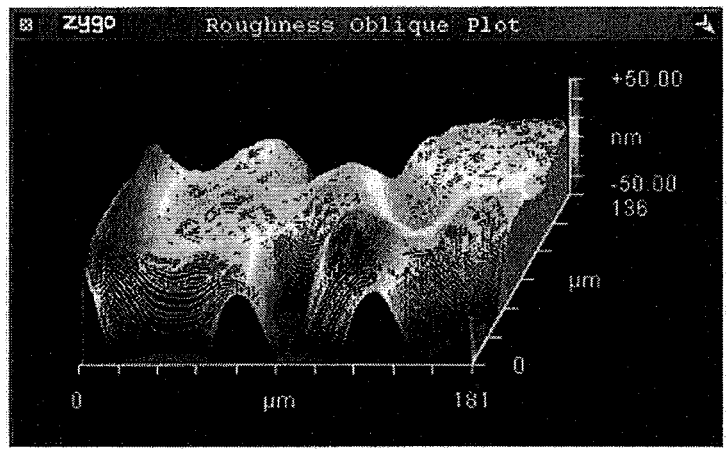
FIG. 12 is a three-dimensional surface profile of sample 7, shown in FIG. 8, obtained by measuring thereof with contactless surface shape measuring machine.
Figure 13:
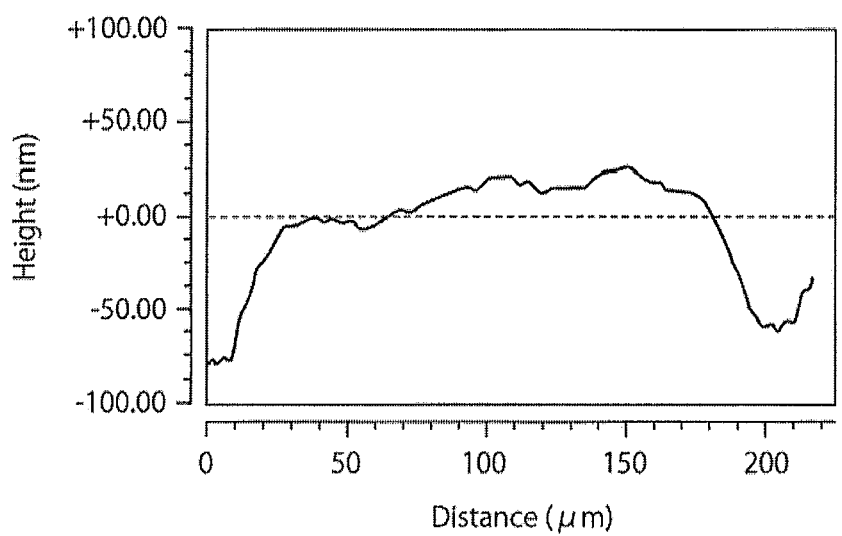
FIG. 13 is a surface profile of sample 6, shown in FIG. 8, obtained by measuring thereof with contactless surface shape measuring machine.

The light-scattering surface of sample 6 indicated by an arrow in FIG. 8 was observed with SEM (1,000 times). As shown in FIG. 9, distinction of convexo-concave shape was difficult. Then, surface profiles of samples 6 and 7 indicated by arrows in FIG. 8 were measured with contactless surface shape measuring machine (NewView5032, manufactured by Zygo Corp.) to obtain profile images shown in FIGS. 10 to 13. The surface profiles shown in FIGS. 10 and 11 relate to sample 6 of which light scattering effect according to the present invention is improved, and is a desirable surface profile in which formation of the convex parts is inhibited with concave parts being formed preferentially. On the other hand, the surface profiles shown in FIGS. 12 and 13 relate to sample 7 which exhibited poor improvement of the light scattering effect.

Example 3

Figure 14:
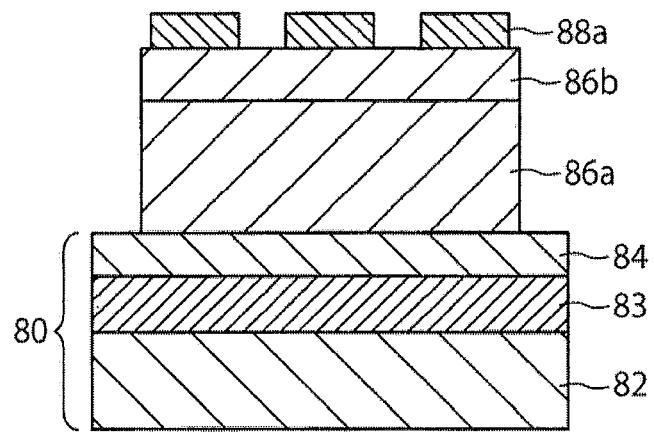
FIG. 14 is a schematic cross-sectional view of a layer structure of a photo-electric element prepared in Example 3.

Evaluation of Photo-Electric Properties (1) Preparation of Photo-Electric Element As shown in FIG. 14, a photo-electric element was prepared using samples 6 and 7 comprising the aluminum reflective layer 83 on the copper foil 82, which was obtained as the electrode foil in Example 2. At the outset, on the aluminum reflective layer 83, n-type semiconductor buffer layer 84 with a thickness of 20 nm composed of ZnO was formed by sputtering. On the buffer layer 84, an interlayer insulation film composed of silicon nitride was formed using a plasma CVD apparatus (PD-2202L, manufactured by Samco Inc.). At that time, by arranging a plurality of thin glasses with a thickness of 0.1 mm, a width of 2 mm and a length of 10 mm, on the electrode foil, in 2 mm width, a part to be light-receiving section was masked. After layering the silicon nitride, the thin glasses were removed. After that, the electrode foil 80 was cleansed with isopropyl alcohol solution heated to a temperature of 40° C. to 50° C., and then dried using nitrogen gas. In turn, P3HT (poly-3-hexylthiophene) and PCBM ((6,6)-phenyl-C61-butyric acid methyl ester) were immersed in a chlorobenzene solution to 10 mg/ml each, and left under an environment at about 25° C. for 24 hours so as to be completely dissolved. The electrode foil 80 was spin coated at 1500 rpm with the mixed chlorobenzene solution in which P3HT and PCBM were dissolve, so that P3HT:PCBM layer 86a could be regulated to have a thickness of 100 nm. Then, the electrode foil was spin coated at 5000 rpm with PEDOT:PSS (poly(3,4-ethylenedioxythiophene/poly(4-styrene-sulfonate)) dispersion solution (1.3% by weight)). The coating was dried on a hot plate at 180° C. for 30 minutes to obtain PEDOT:PSS layer 86b. Gold was layered to have a thickness of about 100 nm with vacuum deposition apparatus to obtain the counter electrode 88a. At that time, the part to be light-receiving section was masked using a comb-like metal mask not to shut out light. Calcination was then performed at 150° C. for 30 minutes under an inert atmosphere (nitrogen). In this way, there was obtained a photo-electric element shown in FIG. 14.

(2) Evaluation of Photo-Electric Properties

Solar cell power generation efficiency of the obtained photo-electric element was measured using a simulator (XES-40S1, manufactured by San-ei electric co., ltd.), IV measuring apparatus (6241A, manufactured by ADCMT Corp.) and a software (manufactured by SUNRISE CORP.) under the conditions of AM (Air Mass) of 1.5 (standard sunlight) or less and incident light strength of 100 mW/cm$^2$. The results of measurement are as shown in the following Table 4 and FIG. 15.

TABLE 4

| | Pv/Pp ratio | Short-circuit current Jsc (mA/cm$^2$) | Open-circuit voltage Voc (V) | Fill factor FF | Conversion efficiency η (%) |
|---|---|---|---|---|---|
| Sample 6 | 4.9 | 10.0 | 0.5 | 0.6 | 3.0 |
| Sample 7 (Comparative) | 1.9 | 8.5 | 0.6 | 0.5 | 2.5 |

Figure 15:
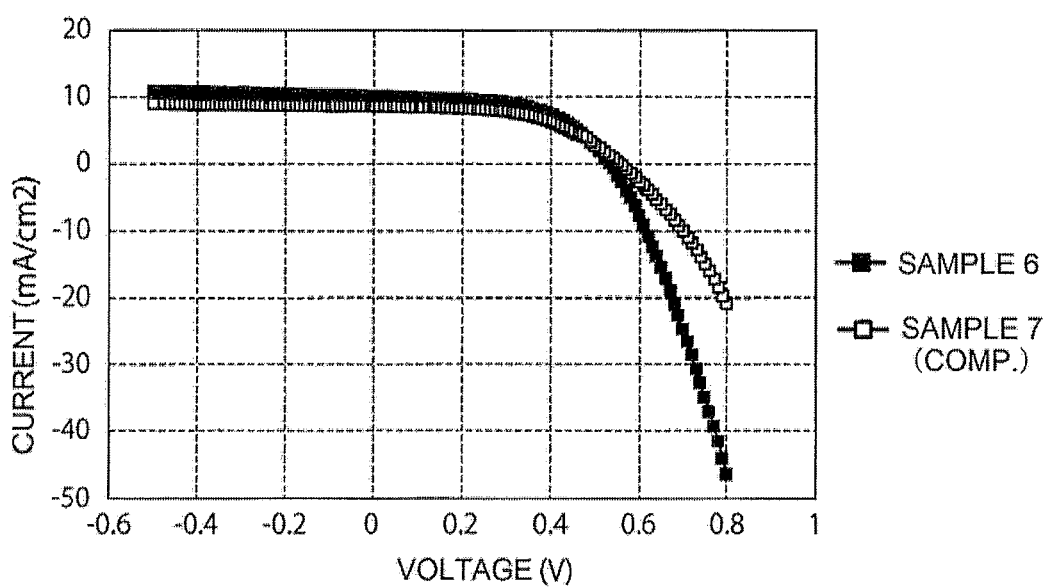
FIG. 15 is a diagram representing a relation between voltage and current which are measured with respect to a photo-electric element in Example 3.

As shown in Table 4 and FIG. 15, sample 6 having a high Pv/Pp ratio has a fill factor FF and a conversion efficiency η that are significantly higher than sample 7 having a low Pv/Pp ratio, and thus it can be understood that sample 6 has a remarkably superior power generation efficiency.

Example 4

Preparation and Evaluation of Concave-Only Electrode Foil

Figure 16:
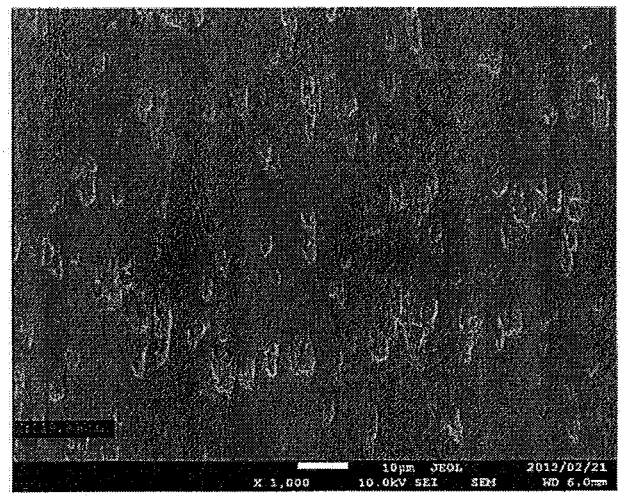
FIG. 16 is an image obtained by observing a surface of sample 8, which is prepared in Example 4, with SEM (1,000 times).
Figure 17:
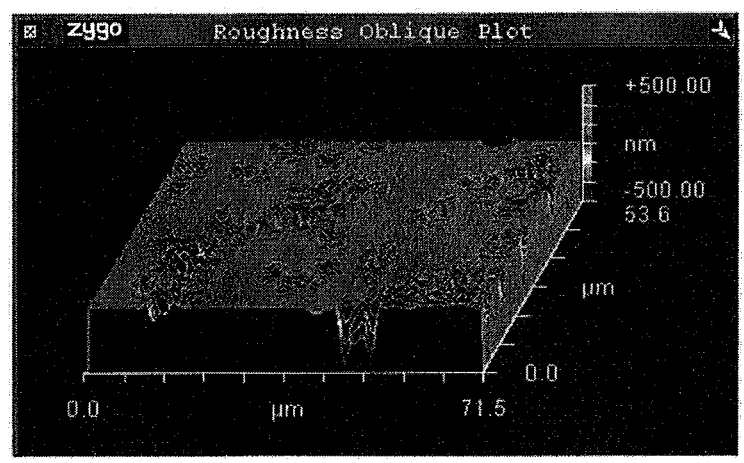
FIG. 17 is a three-dimensional surface profile of sample 8, shown in FIG. 16, obtained by measuring thereof with contactless surface shape measuring machine.
Figure 18:
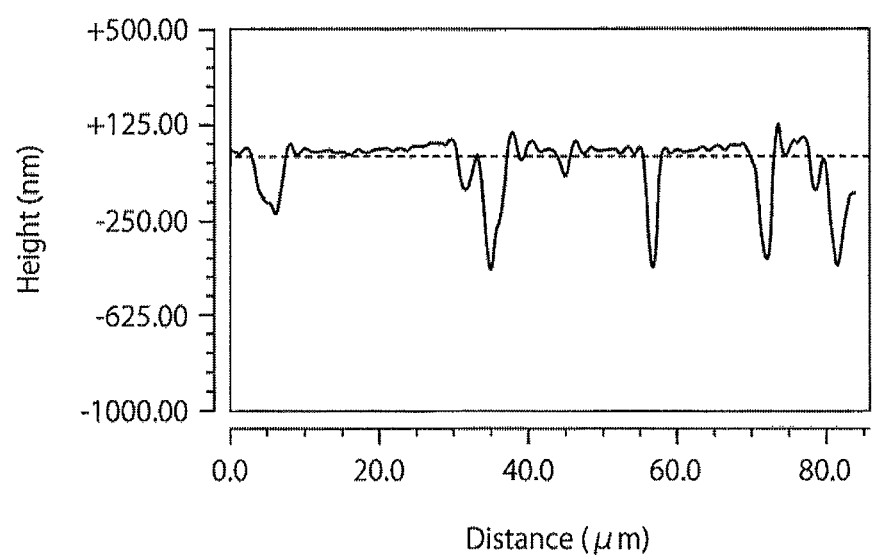
FIG. 18 is a surface profile of sample 8, shown in FIG. 16, obtained by measuring thereof with contactless surface shape measuring machine.

An electrode foil was prepared as sample 8 in the same way as sample 2, except that 35 μm thick commercially available electrolytic copper foil (3EC-III, manufactured by Mitsui Mining & Smelting Co., Ltd.) was used as a metal foil and that the CMP treatment was performed for two minutes. The light-scattering surface of sample 8 was observed with SEM (1,000 times) to confirm surface properties substantially exclusively having concave parts as shown in FIG. 16. Furthermore, the surface profile of samples 8 was measured with contactless surface shape measuring machine (New-View5032, manufactured by Zygo Corp.) to obtain profile images shown in FIGS. 17 and 18. As is apparent from these results, the light-scattering surface of sample 8 had an extremely desirable surface profile in which convex parts were substantially removed while concave parts were formed substantially exclusively. Great majority of observed concave parts had a depth of 1 μm or less and a longitudinal length of 100 μm or less. The number of concave parts was counted with a field of view of the SEM1000 times (10,000 μm$^2$), resulting in about 170. Such an electrode foil on which concave parts are formed substantially exclusively can exhibit a superior light scattering while preventing short circuit between electrodes more certainly, and thereby further improve light-emitting efficiency and power generation efficiency.

The invention claimed is:

1. An electrode foil comprising a metal foil having a thickness of from 1 μm to 250 μm, wherein the electrode foil comprises, on at least one outermost surface thereof, a light-scattering surface having a Pv/Pp ratio of 2.0 or higher, wherein the Pv/Pp ratio is a ratio of a maximum profile valley depth Pv of a profile curve to a maximum profile peak height Pp of the profile curve as measured in a rectangular area of 181 μm×136 μm in accordance with JIS B 0601-2001, and wherein the light-scattering surface has an arithmetic average roughness Ra of 60 nm or less as measured in accordance with JIS B 0601-2001.

2. The electrode foil according to claim 1, wherein the Pv/Pp ratio is 2.5 or higher.

3. The electrode foil according to claim 1, having a thickness of from 10 μm to 150 μm.

4. The electrode foil according to claim 1, having a thickness of from 1 μm to 50 μm.

5. The electrode foil according to claim 1, wherein the metal foil is a copper foil.

6. The electrode foil according to claim 1, further comprising a reflective layer provided at least one side of the metal foil, wherein a surface of the reflective layer constitutes the light-scattering surface.

7. The electrode foil according to claim 1, further comprising a transparent or translucent buffer layer provided directly on at least one side of the metal foil, wherein a surface of the buffer layer constitutes the light-scattering surface.

8. The electrode foil according to claim 1, further comprising a reflective layer provided at least one side of the metal foil; and a transparent or translucent buffer layer provided directly on the reflective layer, wherein a surface of the buffer layer constitutes the light-scattering surface.

9. The electrode foil according to claim 1, wherein the electrode foil has a thickness of from 1 μm to 300 μm.

10. The electrode foil according to claim 1 for use as an electrode combined with a supporting base material of flexible electronic devices.

11. The electrode foil according to claim 1 for use as an electrode of a light-emitting element or a photo-electric element.

12. The electrode foil according to claim 1, comprising the light-scattering surface on both surfaces of the electrode foil.

13. The electrode foil according to claim 1, wherein the light-scattering surface has concave parts having depths of 1 μm or less and major axis diameters of 100 μm or less, the number of the concave parts being 200 or less within an area of 10,000 μm².

14. An electronic device comprising:
an electrode foil according to claim 1; and
a semiconductor functional layer having semiconductor properties, the semiconductor functional layer being provided on the light-scattering surface of the electrode foil.

15. The electronic device according to claim 14, wherein the semiconductor functional layer is formed directly on the light-scattering surface.

16. The electronic device according to claim 14, wherein the semiconductor functional layer has a function of excitation light-emission or photoexcitation power generation, and thereby the electronic device functions as a light-emitting element or a photo-electric element.

17. The electronic device according to claim 14, further comprising a transparent or translucent counter electrode provided on the semiconductor layer.

18. The electronic device according to claim 14, comprising the semiconductor functional layer on both surfaces of the electrode foil.

* * * * *

UNITED STATES PATENT AND TRADEMARK OFFICE
CERTIFICATE OF CORRECTION

PATENT NO. : 9,029,885 B2
APPLICATION NO. : 13/981804
DATED : May 12, 2015
INVENTOR(S) : Yoshinori Matsuura et al.

It is certified that error appears in the above-identified patent and that said Letters Patent is hereby corrected as shown below:

In the Claims

Column 22, Line 61, Claim 6, after "provided" insert -- on --

Column 23, Line 2, Claim 8, after "provided" insert -- on --

Signed and Sealed this
Nineteenth Day of July, 2016

Michelle K. Lee
*Director of the United States Patent and Trademark Office*